United States Patent
Mow et al.

(10) Patent No.: US 8,010,063 B2
(45) Date of Patent: Aug. 30, 2011

(54) SIGNAL ENHANCEMENT IN RF TRANSMITTERS EMPLOYING NON-LINEAR FILTERING

(75) Inventors: Matthew Mow, Cupertino, CA (US); Richard W. D. Booth, San Jose, CA (US)

(73) Assignee: Panasonic Corporation, Osaka (JP)

( * ) Notice: Subject to any disclaimer, the term of this patent is extended or adjusted under 35 U.S.C. 154(b) by 775 days.

(21) Appl. No.: 12/122,610

(22) Filed: May 16, 2008

(65) Prior Publication Data

US 2008/0299919 A1    Dec. 4, 2008

Related U.S. Application Data

(60) Provisional application No. 60/932,544, filed on May 31, 2007.

(51) Int. Cl.
*H04B 1/02* (2006.01)
(52) U.S. Cl. .................. 455/102; 455/110; 455/119
(58) Field of Classification Search .............. 455/91, 455/102, 103, 104, 108, 110, 114.1, 118, 455/119; 330/10, 129, 149
See application file for complete search history.

(56) References Cited

U.S. PATENT DOCUMENTS

| | | | |
|---|---|---|---|
| 5,727,026 A | 3/1998 | Beukema | |
| 6,760,572 B2 | 7/2004 | Noori | |
| 7,054,385 B2 | 5/2006 | Booth et al. | |
| 7,236,753 B2 * | 6/2007 | Zipper | 455/102 |
| 2003/0102910 A1 * | 6/2003 | Sevic et al. | 330/10 |
| 2004/0219891 A1 * | 11/2004 | Hadjichristos | 455/102 |
| 2006/0105715 A1 * | 5/2006 | Kodani et al. | 455/63.1 |

* cited by examiner

*Primary Examiner* — Thanh Le

(57) ABSTRACT

A communications transmitter having a main transmit chain for main signal features and one or more auxiliary transmit chains for auxiliary signal enhancements. In one embodiment, a communications signal is produced by digitally processing a representation of a desired signal so as to limit a trajectory of a signal represented by a resulting processed signal. A digital representation of a difference signal approximating a difference between the processed signal and the desired signal is produced. A first modulated, amplified signal is produced in dependence on the processed signal, and a second modulated, amplified signal is produced in response to the difference signal. The first modulated, amplified signal and the second modulated, amplified signal are combined to produce the desired signal. In this manner, a main transmit chain may be optimized with respect to other properties than signal quality (e.g., power efficiency), while one or more auxiliary transmit chains may be used to enhance the signal quality of the final signal.

37 Claims, 6 Drawing Sheets

SIGNAL ENHANCEMENT IN RF TRANSMITTERS EMPLOYING NON-LINEAR FILTERING

CROSS-REFERENCE TO RELATED APPLICATIONS

This patent application claims the benefit of U.S. Provisional Patent Application No. 60/932,544, filed on May 31, 2007, the disclosure of which is hereby incorporated by reference.

FIELD OF THE INVENTION

The present invention relates to communications transmitters, particular RF communications transmitters.

BACKGROUND OF THE INVENTION

Nonlinear signal filtering technology has been shown to be an effective method to limit the peak-to-minimum ratio of an envelope varying signal (for example as described in U.S. Pat. No. 7,054,385 issued May 30, 2006 entitled "Reduction of average-to-minimum power ratio in communications signals", incorporated herein by reference), for signals with moderate peak-to-average power ratio. Under these conditions, this method provides for acceptable degradation in in-band performance measurements (e.g., error vector magnitude, or EVM, and rho, or the normalized cross-correlation coefficient between the transmitted signal and its ideal version) while the out of band performance (e.g., Adjacent Channel Power Ratio, or ACPR, Adjacent Channel Leakage Ratio, or ACLR, etc.) is not significantly degraded.

For signals that have large peak-to-minimum and large peak-to-average power ratios (e.g., UMTS downlink and Multi-carrier signals) extensions of the aforementioned non-linear signal filtering technique can be applied. However, their effectiveness is limited due to the distortion they introduce to the signal. While extensions of these methods provide indiscernible degradation on the signal power spectral density (PSD), due to the distribution of the envelope of high peak to average power ratio signals the in-band signal fidelity (EVM) is significantly degraded. As such, there is a trade-off of in-band signal fidelity (EVM) with envelope minimum, where higher envelope minimum values cause higher distortion (i.e., higher EVM).

A similar problem may arise in the case of U.S. Pat. No. 5,727,026, "Method and apparatus for peak suppression using complex scaling values," incorporated herein by reference, which addresses a distinctly different problem, namely reducing the Peak-to-Average power Ratio (PAR) of a communication signal. Large PAR is a problem for many, if not most, conventional power amplifiers (PA). A signal with a large PAR requires highly linear amplification, which in turn affects the power efficiency of the PA. Reduction is accomplished by adding a pulse to the original pulse-shaped waveform, with the pulse having an appropriate magnitude and phase such that the peak power is reduced. The pulse can be designed to have any desired spectral characteristics, so that the distortion can be kept in-band (to optimize the Adjacent Channel Power Ratio (ACPR)), or allowed to leak somewhat out-of-band (to optimize the error vector magnitude (EVM)). In any event, signal distortion is introduced. Not all signal types may be expected to tolerate such distortions.

The present invention addresses these signal degradation problems.

SUMMARY OF THE INVENTION

The present invention, generally speaking, provides for a communications transmitter having a main transmit chain for main signal features and one or more auxiliary transmit chains for auxiliary signal enhancements. In one embodiment, a communications signal is produced by digitally processing a representation of a desired signal so as to limit a trajectory of a signal represented by a resulting processed signal. "Signal trajectory" is used herein to mean the amplitude and phase of a time-varying RF signal over an interval of time, as may be represented on a polar signal plot, for example. A digital representation of a difference signal approximating a difference between the processed signal and the desired signal is produced. A first modulated, amplified signal is produced in dependence on the processed signal, and a second modulated, amplified signal is produced in response to the difference signal. The first modulated, amplified signal and the second modulated, amplified signal are combined to produce the desired signal. In this manner, a main transmit chain may be optimized with respect to other properties than signal quality (e.g., power efficiency), while one or more auxiliary transmit chains may be used to enhance the signal quality of the final signal.

Other features and advantages of the present invention will be understood upon reading and understanding the detailed description of the preferred exemplary embodiments, found hereinbelow, in conjunction with reference to the drawings, a brief description of which are provided below.

DETAILED DESCRIPTION

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 1:
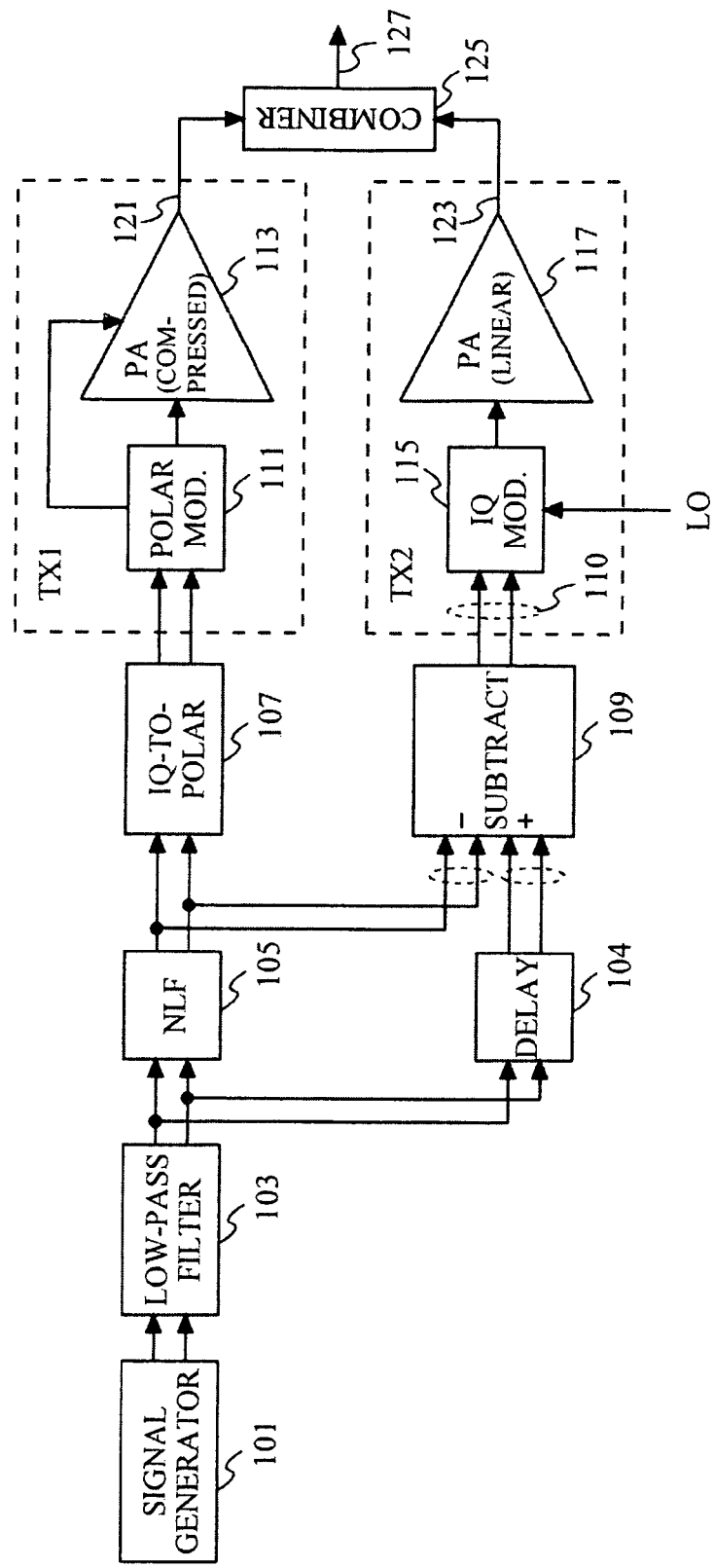
FIG. 1 is a block diagram of a communications transmitter in which "floor restoration" processing is used to enhance signal quality of the final signal.

Referring now to FIG. 1, a block diagram is shown of a communications transmitter in which floor restoration processing is used to enhance signal quality of the final signal.

A signal generator 101 generates a description of the desired communications signal in IQ form. The IQ signal components are filtered in a low-pass filter 103 and applied to a non-linear filter 105. In a preferred embodiment, the signal generator 101, low-pass filter 103 and non-linear filter 105 are digital processing blocks.

Within the non-linear filter block, the IQ signal is modified in such a way as to establish a "hole" within a signal diagram of the resulting signal. In general, the non-linear filter block performs amplitude minimum reduction by analyzing the signal to be transmitted, and adding carefully formed pulses into the signal in time intervals in which the signal magnitude is smaller than some threshold. Such processing is described in detail in the aforementioned U.S. Pat. No. 7,054,385.

A modified signal resulting from non-linear filtering is applied to a polar converter 107 and to a subtraction block 109. The polar converter 107 converts the modified signal from IQ form to polar form (i.e., $\rho$, $\theta$). The polar form of the signal is then applied to a first transmit path TX1.

The subtraction block 109 receives the modified signal resulting from non-linear filtering and has as its other input the IQ signal prior to non-linear filtering, delayed by a delay element 104. The subtraction block 109 therefore forms a difference signal 110 equal to a difference between the IQ signal prior to non-linear filtering and the IQ signal after non-linear filtering. This difference signal is applied to a second transmit path TX2. In the illustrated embodiment, analog processing of the signal (or signal components) to be transmitted begins within the identified transmit paths TX1, TX2.

Within the first transmit path TX1, a polar modulator 111 drives a power amplifier 113. The power amplifier 113 is preferably a compressed power amplifier or a switch-mode power amplifier. The function of the polar modulator 111 is to produce control signals for the power amplifier 113, including a phase control signal and an envelope control signal. The phase control signal drives the power amplifier 113 as an on-off switch. The envelope control signal serves as the control for the power supply of the power amplifier 113. In this manner, a main signal 121—a high-power analog version of the modified signal (subjected to non-linear filtering)—is produced at high efficiencies. Further details concerning the arrangement of such a transmit path may be found in the aforementioned U.S. Pat. No. 7,054,385.

The second transmit path TX2 may be largely conventional and is shown as including a quadrature modulator 115 and a linear power amplifier 117. The quadrature modulator 115 receives a local oscillator signal LO and produces within the analog domain a small-amplitude (low power) version of the difference signal 110. The linear power amplifier 117 produces a higher-power version of this same signal, resulting in a floor restoration signal 123.

The final step in producing the desired signal 127 is to combine the main signal 121 and the floor restoration signal 123. This is done using a combiner 125. The combiner 125 may be of a type described in detail in U.S. Pat. No. 6,760,572 entitled "Method and apparatus for combining two AC waveforms," incorporated herein by reference. Such a combiner allows for the efficient combining of signal having disparate power levels.

By using two separate transmit paths TX1, TX2 as described, the characteristics of the transmit paths TX1, TX2 may be optimized for the main signal 121 and the floor restoration signal 123, respectively. In the exemplary embodiment of FIG. 1, the first transmit path TX1 used for the main signal 121 exhibits high power efficiency, while the second transmit path TX2 may be better suited for producing a low-power signal, i.e., a signal within the hole region of the main signal 121 produced by the non-linear filter 105.

A similar principle as described in relation to the embodiment of FIG. 1 may be applied in the case of where the Peak-to-Average power Ratio (PAR) of the communication signal is reduced to ease requirements or improve efficiency of a main transmit path.

Figure 2:
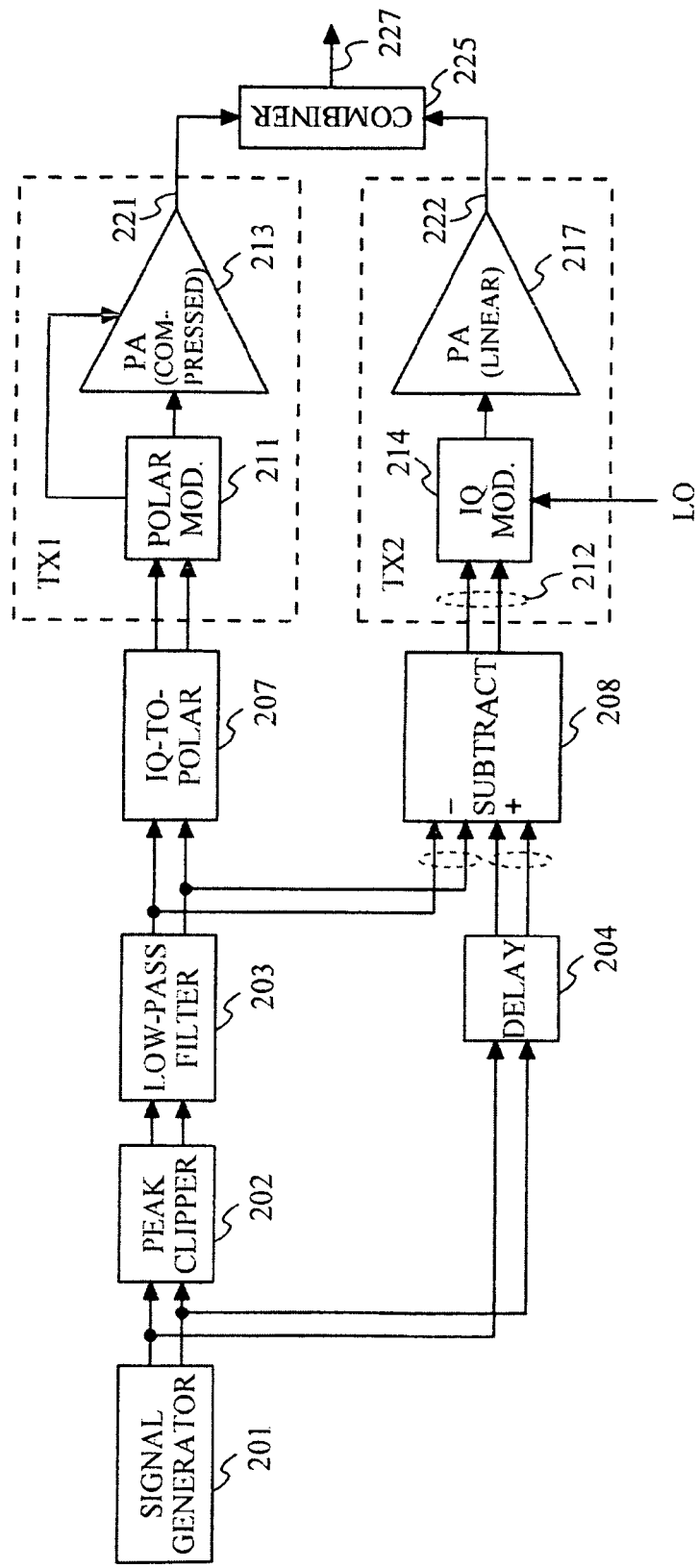
FIG. 2 is a block diagram of a communications transmitter in which "peak restoration" processing is used to enhance signal quality of the final signal.

Referring now to FIG. 2, a block diagram is shown of a communications transmitter in which peak restoration processing is used to enhance signal quality of the final signal.

A signal generator 201 generates a description of the desired communications signal in IQ form. The IQ signal components are processed by a peak clipper 202 prior to being filtered in a low-pass filter 203. In a preferred embodiment, the signal generator 201, peak clipper 202 and low-pass filter 203 are digital processing blocks.

Within the peak clipper 202, the IQ signal is modified in such a way as to establish a maximum peak amplitude within a signal diagram of the resulting signal. In general, the peak clipper 202 performs PAR reduction by analyzing the signal to be transmitted, and adding carefully formed pulses into the signal in time intervals in which the signal magnitude is greater than some threshold. Such processing is described in detail in the aforementioned U.S. Pat. No. 5,727,026.

A modified signal resulting from peak clipping is applied to a polar converter 207 and to a subtraction block 208. The polar converter 207 converts the modified signal from IQ form to polar form (i.e., $\rho$, $\theta$). The polar form of the signal is then applied to a first transmit path TX1.

The subtraction block 208 receives the modified signal resulting from processing of the peak clipper 202 and low-pass filter 203 and has as its other input the IQ signal prior to the peak clipper 202, delayed by a delay element 204. The subtraction block 208 therefore forms a difference signal 212 equal to a difference between the IQ signal prior to peak clipping and the IQ signal after peak clipping. This difference signal 212 is applied to a second transmit path TX2. In the illustrated embodiment, analog processing of the signal (or signal components) to be transmitted begins within the identified transmit paths.

Within the first transmit path TX1, a polar modulator 211 drives a power amplifier 213. The power amplifier 213 is preferably a compressed power amplifier or a switch-mode power amplifier. The function of the polar modulator 211 is to produce control signals for the power amplifier 213, including a phase control signal and an envelope control signal. The phase control signal drives the power amplifier 213 as an on-off switch. The envelope control signal serves as the power supply of the power amplifier 213. In this manner, a main signal 221—a high-power analog version of the modified signal (subjected to non-linear filtering)—is produced at high efficiencies. Further details concerning the arrangement of such a transmit path may be found in the aforementioned U.S. Pat. No. 7,054,385.

The second transmit path TX2 may be largely conventional and is shown as including a quadrature modulator 214 and a linear power amplifier 217. The quadrature modulator 214 receives a local oscillator signal LO and produces within the analog domain a small-amplitude (low power) version of the difference signal 212. The linear power amplifier 217 produces a higher-power version of this same signal, resulting in a peak restoration signal 222.

The final step in producing the desired signal 227 is to combine the main signal 221 and the peak restoration signal 222. This is done using a combiner 225. Once again, the combiner may be of a type described in detail in U.S. Pat. No. 6,760,572 entitled "Method and apparatus for combining two AC waveforms," incorporated herein by reference. Such a combiner allows for the efficient combining of signals having disparate power levels.

Figure 3A:
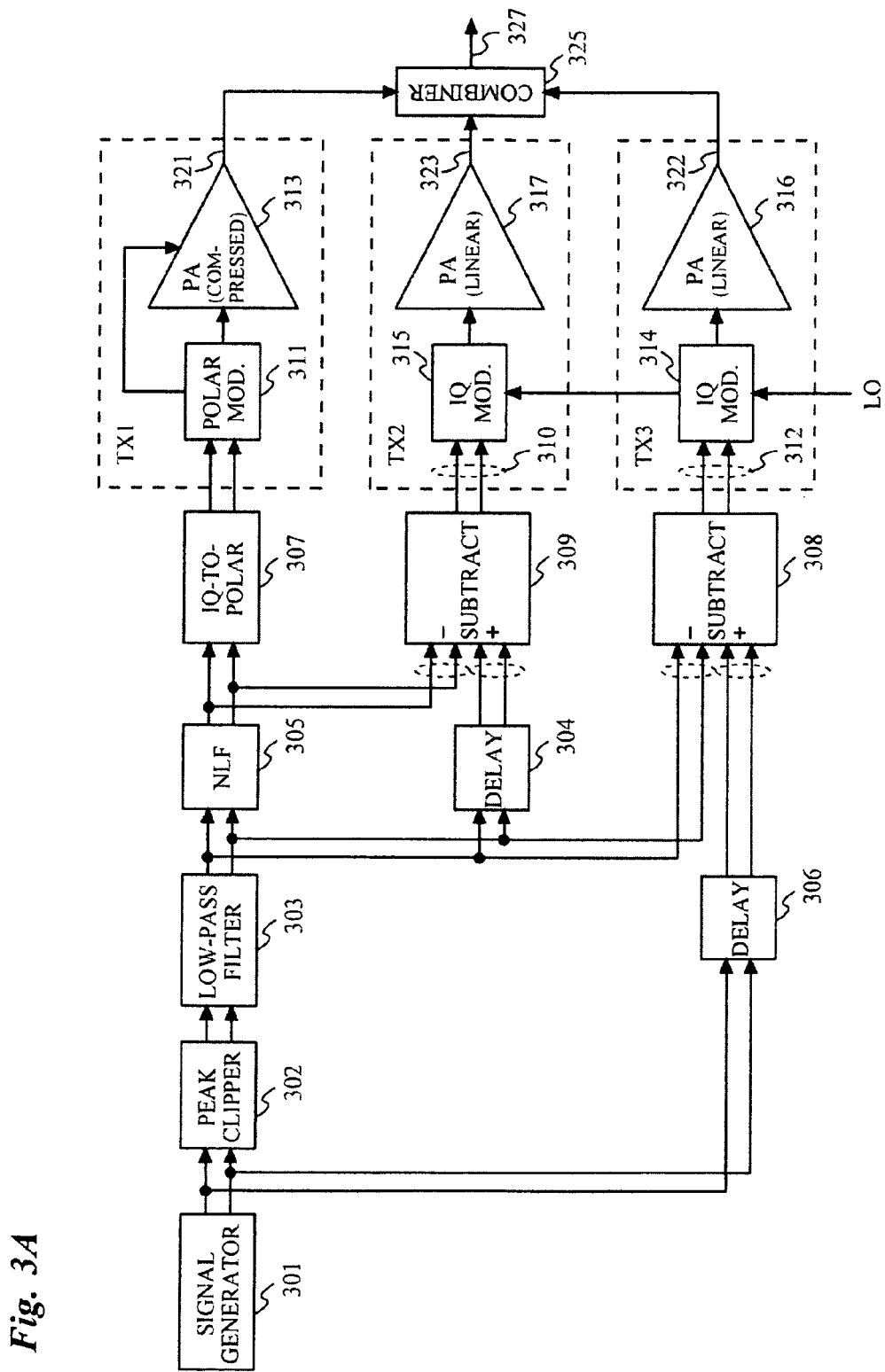
FIG. 3A is a block diagram of a communications transmitter in which both floor restoration and peak restoration processing are used to enhance signal quality of the final signal.

Note that both floor restoration and peak restoration may be applied concurrently. Such a system is illustrated in FIG. 3A, in which components 301, 302, 303, 304, 305, 306, 307, 308, 309, 310, 311, 312, 313, 314, 315, 316, 317, 321, 322, 323, 325 and 327 perform in similar fashion as corresponding components previously described. Note the presence of both a peak clipper 302 and a non-linear filter 305. In the system of FIG. 3A, first, second and third transmit paths (TX1, TX2 and TX3) are used to produce a main signal 321, a floor restoration signal 323 and a peak restoration signal 322, respectively. These three signals are combined in a power combiner 325 to produce the final signal 327.

Figure 3B:
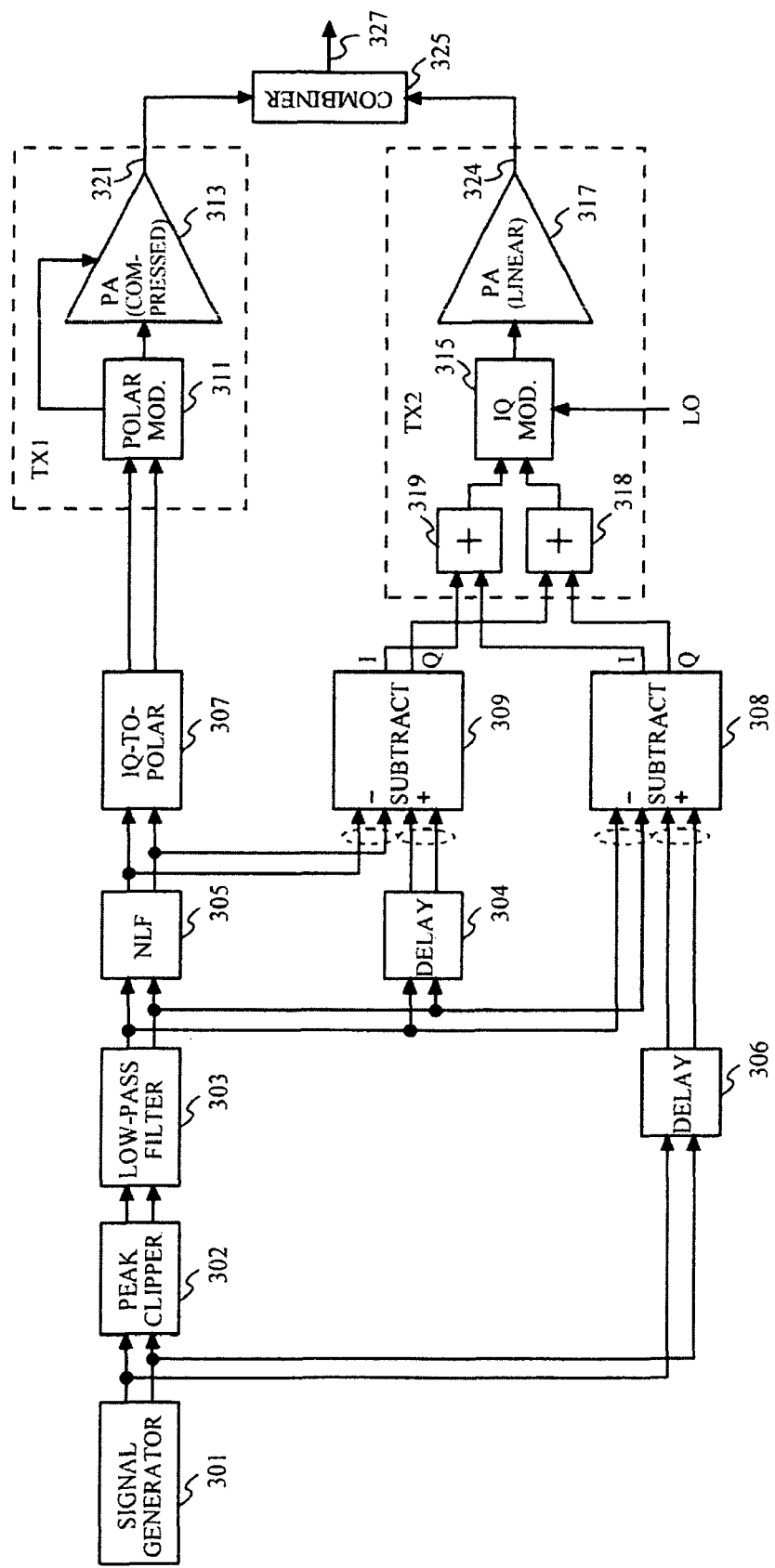
FIG. 3B is a block diagram of another embodiment of a communications transmitter in which both floor restoration and peak restoration processing are used to enhance signal quality of the final signal.

Such a system is illustrated in FIG. 3B, in which components 301, 302, 303, 304, 305, 306, 307, 308, 309, 311, 313, 315, 317, 318, 319, 321, 324, 325 and 327 perform in similar fashion as corresponding components previously described. Note the presence of both a peak clipper 302 and a non-linear filter 305. In the system of FIG. 3B, first and second transmit paths (TX1 and TX2) are used to produce a main signal 321 and a floor/peak restoration signal 324, respectively. An I signal of floor restoration signal and an I signal peak restoration signal are combined in a combiner 319. A Q signal of floor restoration signal and a Q signal peak restoration signal are combined in a combiner 318. These two signals are combined in a power combiner 325 to produce the final signal 327.

Figure 4:
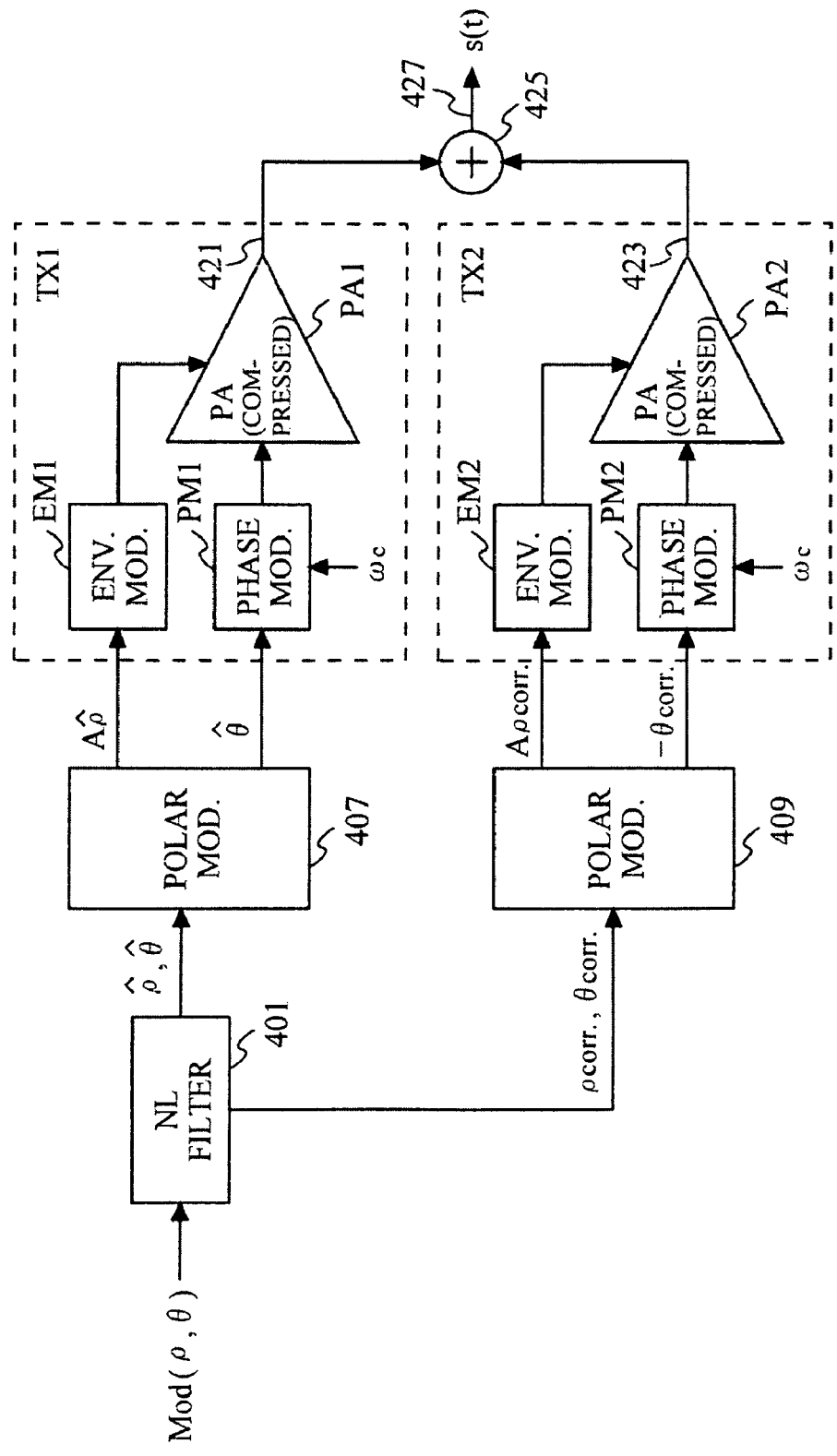
FIG. 4 is a block diagram of another embodiment of a communications transmitter in which floor restoration is used.

Referring now to FIG. 4, a block diagram is shown of another embodiment of a communications transmitter in which floor restoration is used. A signal description (modulation information) Mod is received in polar ($\rho$, $\theta$) form. The signal description is applied to a non-linear filter 401. The non-linear filter 401 operates in a similar fashion as in the previously-described embodiments to output a modified signal $\hat{\rho}$, $\hat{\theta}$ that exhibits a hole about the origin and a correction signal $\rho_{corr.}$, $\theta_{corr.}$ which when added to the modified signal produces the original signal. The modified signal $\hat{\rho}$, $\hat{\theta}$ and the correction signal $\rho_{corr.}$, $\theta_{corr.}$ are applied to respective polar modulators 407 and 409. The polar modulator 407 outputs an amplitude signal $A\rho$ and a phase signal $\hat{\theta}$ as a function of $\hat{\rho}$, $\hat{\theta}$. The polar modulator 409 performs a similar function; however, the phase information is inverted such that the correction signal, when it is later combined with the main signal, combines in a subtractive sense in order to form the desired hole about the origin. The output signals of the polar modulator 409 are therefore $A\rho_{corr.}$ and $-\theta_{corr.}$. The output signals of the respective polar modulators 407 and 409 are applied to first and second transmit chains TX1, TX2, respectively.

The first transmit chain TX1 operates at a relatively high power level, and the second transmit chain TX2 operates at a relatively low power level. In other respects, the first and second transmit chains TX1, TX2, in the present embodiment, are largely the same, each including a phase modulator PM, an envelope modulator EM and a compressed power amplifier PA.

The phase modulator PM and envelope modulator EM function largely as drivers for the compressed power amplifier PA. More particularly, the phase modulator PM receives phase information ($\hat{\theta}$ or $-\theta_{corr.}$) and a carrier signal $\omega_c$ and in response thereto produces a phase modulated control signal that drives the power amplifier as an on-off switch. The envelope modulator EM receives amplitude information ($A\rho$ or $A\rho_{corr.}$) and outputs an envelope control signal that serves as the control of the power supply of the compressed power amplifier PA.

The output signals 421 and 423 of the first and second transmit chains TX1, TX2 are combined in a (preferably low-loss) combiner 425 to produce a final output signal s(t) (427).

When a signal trajectory passes through the origin, the signal experiences a phase inversion, or instantaneous phase change of 180 degrees. A polar-modulation-based transmit cannot produce such a signal without introducing distortion. Hence, the second transmit chain of FIG. 4 will inevitably introduce some distortion into the signal. However, because the power level of the second transmit chain is very low, this distortion will also be low.

Figure 5:
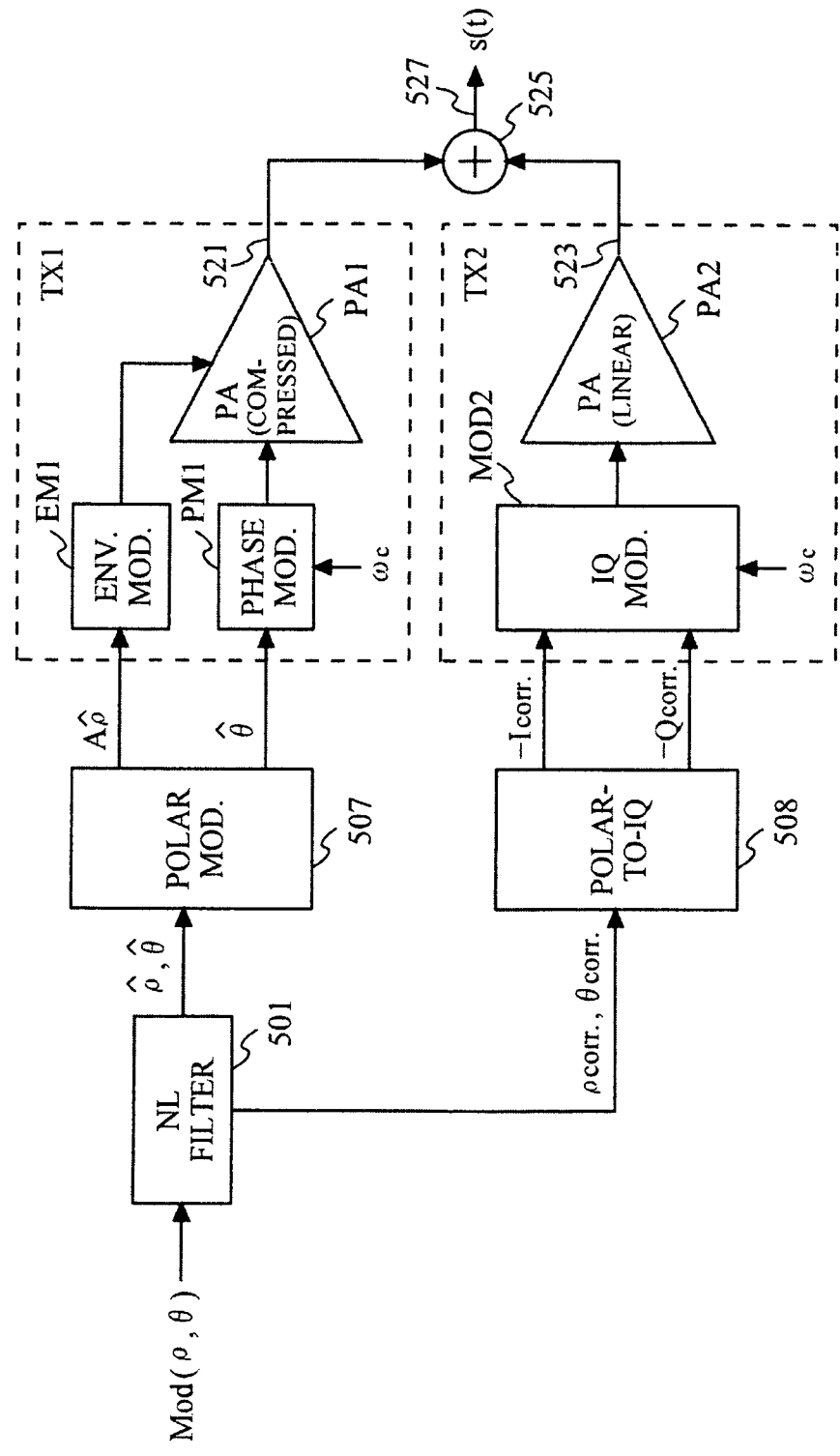
FIG. 5 is a block diagram of a further embodiment of a communications transmitter in which floor restoration is used.

Referring to FIG. 5, a block diagram is shown of a further embodiment of a communications transmitter in which floor restoration is used, and in which components 501, 507, PM1, EM1, PA1, 521, 523, 525 and 527 perform in similar fashion as corresponding components previously described. As compared to the previous embodiment, in this embodiment, the second transmit chain TX2 uses a conventional arrangement of a quadrature modulator MOD2 and a linear power amplifier PA2. The second transmit chain TX2 is preceded by a polar-to-IQ converter 508 that converts the correction signal $\rho_{corr.}$, $\theta_{corr.}$ from polar form to IQ form.

In the embodiment of FIG. 5, as in the previous embodiments, a main transmit chain may be optimized with respect to other properties than signal quality (e.g., power efficiency), while one or more auxiliary transmit chains may be used to enhance the signal quality of the final signal.

Although preferred embodiments of the present invention have been described in detail, it should be understood that various changes, substitutions and alternations can be made without departing from the spirit and scope of the inventions as defined by the appended claims.

What is claimed is:

1. A method of producing a communications signal, comprising:
    digitally processing a representation of a desired signal to produce a resulting processed signal, the resulting processed signal representing a signal having a trajectory limited by said processing;
    producing a digital representation of a difference signal approximating a difference between the processed signal and the desired signal;
    producing a first modulated, amplified signal in dependence on the processed signal;
    producing a second modulated, amplified signal in response to the difference signal; and
    combining the first modulated, amplified signal and the second modulated, amplified signal to produce the desired signal.

2. The method of claim 1, wherein the step of digitally processing comprises enforcing a maximum amplitude on the resulting processed signal.

3. The method of claim 1, wherein the step of digitally processing comprises enforcing a minimum amplitude on the resulting processed signal.

4. The method of claim 1, wherein the step of producing a first modulated, amplified signal comprises performing polar modulation in response to the processed signal to produce a first phase signal and a second envelope signal.

5. The method of claim 4, wherein the step of producing a first modulated, amplified signal comprises using a compressed amplifier to produce the first modulated, amplified signal in response to the first phase signal and the first envelope signal.

6. The method of claim 1, wherein the step of producing a second modulated, amplified signal comprises performing polar modulation in response to the processed signal to produce a second phase signal and a second envelope signal.

7. The method of claim 6, wherein the step of producing a second modulated, amplified signal comprises using a compressed amplifier to produce the second modulated, amplified signal in response to the second phase signal and the second envelope signal.

8. The method of claim 1, wherein the step of producing a second modulated, amplified signal comprises performing a conversion operation in response to the processed signal to produce an I signal and a Q signal.

9. The method of claim 8, wherein the step of producing a second modulated, amplified signal comprises performing IQ modulation in response to the I signal and the Q signal to produce a modulated signal.

10. The method of claim 9, wherein the step of producing a second modulated, amplified signal comprises amplifying the modulated signal using a linear amplifier.

11. A method of producing a communications signal, comprising:
 digitally processing a representation of a desired signal to produce a resulting processed signal, the resulting processed signal representing a signal having a trajectory limited by said processing;
 producing a digital representation of a first difference component signal approximating a first difference component between the processed signal and the desired signal;
 producing a digital representation of a second difference component signal approximating a second difference component between the processed signal and the desired signal;
 producing a first modulated, amplified signal in dependence on the processed signal;
 producing a second modulated, amplified signal in response to the first difference signal;
 producing a third modulated, amplified signal in response to the second difference signal; and
 combining the first modulated, amplified signal, the second modulated, amplified signal and the third modulated, amplified signal to produce the desired signal.

12. The method of claim 11, wherein the step of digitally processing comprises enforcing both a maximum amplitude and a minimum amplitude on the resulting processed signal.

13. The method of claim 11, wherein the first difference component represents a difference resulting from enforcing a maximum amplitude on the resulting processed signal.

14. The method of claim 11, wherein the second difference component represents a difference resulting from enforcing a minimum amplitude on the resulting processed signal.

15. A communications transmitter, comprising:
 circuitry for digitally processing a representation of a desired signal to produce a resulting processed signal, the resulting processed signal representing a signal having a trajectory limited by said processing;
 circuitry for producing a digital representation of a difference signal approximating a difference between the processed signal and the desired signal;
 a first processing chain for producing a first modulated, amplified signal in dependence on the processed signal;
 a second processing chain for producing a second modulated, amplified signal in response to the difference signal; and
 a combiner for combining the first modulated, amplified signal and the second modulated, amplified signal to produce the desired signal.

16. The apparatus of claim 15, wherein the circuitry for digitally processing enforces a maximum amplitude on the resulting processed signal.

17. The apparatus of claim 15, wherein the circuitry for digitally processing enforces a minimum amplitude on the resulting processed signal.

18. The apparatus of claim 15, wherein the first processing chain for producing a first modulated, amplified signal comprises a polar modulator for performing polar modulation in response to the processed signal to produce a first phase signal and an first envelope signal.

19. The apparatus of claim 18, wherein the first processing chain for producing a first modulated, amplified signal comprises a compressed amplifier responsive to the first phase signal and the first envelope signal for producing the first modulated, amplified signal.

20. The apparatus of claim 15, wherein the second processing chain for producing a second modulated, amplified signal comprises a polar modulator for performing polar modulation in response to the processed signal to produce a second phase signal and a second envelope signal.

21. The apparatus of claim 20, wherein the second processing chain for producing a first modulated, amplified signal comprises a compressed amplifier responsive to the second phase signal and the second envelope signal for producing the second modulated, amplified signal.

22. The apparatus of claim 15, wherein the processing chain for producing a second modulated, amplified signal comprises a signal converter for performing a conversion operation in response to the processed signal to produce an I signal and a Q signal.

23. The apparatus of claim 22, wherein the processing chain for producing a second modulated, amplified signal comprises an IQ modulator for performing IQ modulation in response to the I signal and the Q signal to produce a modulated signal.

24. The apparatus of claim 23, wherein the second processing chain for producing a second modulated, amplified signal comprises a linear amplifier for amplifying the modulated signal.

25. A communications transmitter, comprising:
 circuitry for digitally processing a representation of a desired signal to produce a resulting processed signal, the resulting processed signal representing a signal having a trajectory limited by said processing;
 first difference circuitry for producing a digital representation of a first difference component signal approximating a first difference component between the processed signal and the desired signal;
 second difference circuitry for producing a digital representation of a second difference component signal approximating a second difference component between the processed signal and the desired signal;
 a first processing chain for producing a first modulated, amplified signal in dependence on the processed signal;
 a second processing chain for producing a second modulated, amplified signal in response to the first difference signal;
 a third processing chain for producing a third modulated, amplified signal in response to the second difference signal; and
 a combiner for combining the first modulated, amplified signal, the second modulated, amplified signal and the third modulated, amplified signal to produce the desired signal.

26. The apparatus of claim 25, wherein the circuitry for digitally processing enforces both a maximum amplitude and a minimum amplitude on the resulting processed signal.

27. The apparatus of claim 25, wherein the first difference component represents a difference resulting from enforcing a maximum amplitude on the resulting processed signal.

28. The apparatus of claim 25, wherein the second difference component represents a difference resulting from enforcing a minimum amplitude on the resulting processed signal.

29. A communications transmitter, comprising:
   means for digitally processing a representation of a desired signal to produce a resulting processed signal, the resulting processed signal representing a signal having a trajectory limited by said processing;
   means for producing a digital representation of a difference signal approximating a difference between the processed signal and the desired signal;
   means for producing a first modulated, amplified signal in dependence on the processed signal;
   means for producing a second modulated, amplified signal in response to the difference signal; and
   means for combining the first modulated, amplified signal and the second modulated, amplified signal to produce the desired signal.

30. The apparatus of claim 29, wherein the means for digitally processing comprises enforcing a maximum amplitude on the resulting processed signal.

31. The apparatus of claim 29, wherein the means for digitally processing comprises enforcing a minimum amplitude on the resulting processed signal.

32. The apparatus of claim 29, wherein the means for producing a first modulated, amplified signal comprises means for performing polar modulation in response to the processed signal to produce a first phase signal and a second envelope signal.

33. A communications transmitter, comprising:
   means for digitally processing a representation of a desired signal to produce a resulting processed signal, the resulting processed signal representing a signal having a trajectory limited by said processing;
   means for producing a digital representation of a first difference component signal approximating a first difference component between the processed signal and the desired signal;
   means for producing a digital representation of a second difference component signal approximating a second difference component between the processed signal and the desired signal;
   means for producing a first modulated, amplified signal in dependence on the processed signal;
   means for producing second modulated, amplified signal in response to the first difference signal;
   means for producing a third modulated, amplified signal in response to the second difference signal; and
   means for combining the first modulated, amplified signal, the second modulated, amplified signal and the third modulated, amplified signal to produce the desired signal.

34. The apparatus of claim 33, wherein the means for digitally processing comprises enforcing both a maximum amplitude and a minimum amplitude on the resulting processed signal.

35. The apparatus of claim 33, wherein the first difference component represents a difference resulting from enforcing a maximum amplitude on the resulting processed signal.

36. The apparatus of claim 33, wherein the second difference component represents a difference resulting from enforcing a minimum amplitude on the resulting processed signal.

37. A method of producing a communications signal, comprising:
   digitally processing a representation of a desired signal to produce a resulting processed signal, the resulting processed signal representing a signal having a trajectory limited by said processing;
   producing a digital representation of a first difference component signal approximating a first difference component between the processed signal and the desired signal;
   producing a digital representation of a second difference component signal approximating a second difference component between the processed signal and the desired signal;
   producing a first modulated, amplified signal in dependence on the processed signal;
   producing a second modulated, amplified signal based on the first difference signal and the second difference signal; and
   combining the first modulated, amplified signal, and the second modulated, amplified signal to produce the desired signal.

* * * * *